(12) United States Patent
Mayhew et al.

(10) Patent No.: US 8,879,301 B2
(45) Date of Patent: Nov. 4, 2014

(54) METHOD AND APPARATUS FOR CONTROLLING STATE INFORMATION RETENTION IN AN APPARATUS

(75) Inventors: David Mayhew, Northborough, MA (US); Mark Hummel, Franklin, MA (US); Michael Ignatowski, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 87 days.

(21) Appl. No.: 13/616,142

(22) Filed: Sep. 14, 2012

(65) Prior Publication Data

US 2013/0070515 A1 Mar. 21, 2013

Related U.S. Application Data

(60) Provisional application No. 61/535,733, filed on Sep. 16, 2011, provisional application No. 61/535,730, filed on Sep. 16, 2011.

(51) Int. Cl.

| | |
|---|---|
| *G11C 11/00* | (2006.01) |
| *G11C 13/00* | (2006.01) |
| *G11C 14/00* | (2006.01) |
| *H03K 19/00* | (2006.01) |
| *G11C 11/412* | (2006.01) |
| *G11C 5/00* | (2006.01) |

(52) U.S. Cl.
CPC ........ *G11C 13/0002* (2013.01); *G11C 14/0045* (2013.01); *H03K 19/0019* (2013.01); *G11C 11/4125* (2013.01); *H03K 19/0016* (2013.01); *G11C 5/005* (2013.01)
USPC .......................................... 365/148; 365/100

(58) Field of Classification Search
CPC ........... G11C 13/0002; G11C 14/0045; G11C 11/4125; G11C 5/005
USPC ........... 365/100, 148, 201; 712/228; 718/108, 718/102
See application file for complete search history.

(56) References Cited

U.S. PATENT DOCUMENTS

| | | | | |
|---|---|---|---|---|
| 5,021,993 | A | * | 6/1991 | Matoba et al. ................. 712/228 |
| 6,014,132 | A | * | 1/2000 | Shimada et al. ............... 345/173 |
| 6,223,279 | B1 | * | 4/2001 | Nishimura et al. ........... 712/228 |
| 2007/0022428 | A1 | * | 1/2007 | Yamasaki ...................... 718/108 |
| 2008/0090337 | A1 | | 4/2008 | Williams |
| 2013/0069964 | A1 | * | 3/2013 | Wuu et al. ...................... 345/530 |
| 2013/0070513 | A1 | * | 3/2013 | Weiss et al. .................... 365/148 |
| 2013/0117593 | A1 | * | 5/2013 | Nooney et al. ................. 713/322 |

* cited by examiner

*Primary Examiner* — Gene Auduong

(74) *Attorney, Agent, or Firm* — Faegre Baker Daniels LLP

(57) ABSTRACT

A method and apparatus for controlling state information retention determines at least a state information save or restore condition for at least one processing circuit such as one or more CPU or GPU cores or pipelines, in an integrated circuit. In response to determining the state information save or restore condition, the method and apparatus controls either or both of saving or restoring of state information for different virtual machines operating on the processing circuit, into corresponding on-die persistent passive variable resistance memory. The state information save or restore condition is a virtual machine level state information save or restore condition. State information for each of differing virtual machines is saved or restored from differing on-die passive variable resistance memory cells that are assigned on a per-virtual machine basis.

20 Claims, 13 Drawing Sheets

METHOD AND APPARATUS FOR CONTROLLING STATE INFORMATION RETENTION IN AN APPARATUS

CROSS-REFERENCE TO RELATED APPLICATIONS

This application claims priority to Provisional Application Ser. No. 61/535,733, filed on Sep. 16, 2011, having inventors David Mayhew et al., titled "METHOD AND APPARATUS FOR CONTROLLING STATE INFORMATION RETENTION IN AN APPARATUS" which is incorporated herein by reference. This application is related to co-pending application Ser. No. 13/561,547, filed on Jul. 30, 2012, having inventors Donald R. Weiss et al., Titled "METHOD AND APPARATUS FOR DIRECT BACKUP OF MEMORY CIRCUITS", which claims priority to Provisional Application Ser. No. 61/535,730, filed on Sep. 16, 2011, having inventors Donald R. Weiss et al., titled "METHOD AND APPARATUS FOR DIRECT BACKUP OF MEMORY CIRCUITS".

BACKGROUND OF THE INVENTION

The disclosure relates generally to circuits and methods to backup state information in integrated circuits and more particularly to circuits and methods that save the state of the processor or logic chip and methods for performing same.

Logic chips and processors such as central processing units (CPUs), graphics processing units (GPUs), DSPs and other processing circuits in servers and other devices employ known solutions to save the state information that are in various locations throughout the processor when, for example, power is to be shut down on the device or for switching to handle different processing threads or for other suitable purposes. Flip-flops as known in the art may be used in pipelines to store state information and may be used, for example, in state machines or any other suitable structure to allow devices to start and stop when power is to be removed, for example or if a pipeline is to be temporarily held to allow another thread to be processed. Saving the state of the processor can involve the tedious process of reading all of the architected states of the chip (or part of the chip) that is to be powered off and saved out to a section of the chip not to be powered off or power gated. Other solutions utilize the writing of the state of the chip onto an off-chip non-volatile storage device through a system bus. The off-chip memory retains the data after power has been removed, such as a ROM disk or other non-volatile storage.

FIG. 1 illustrates one example of a prior art device 100 that employs a chip or system bus 102 that communicate with a non-volatile disk memory 104 (e.g., hard drive) or other storage 106. An integrated circuit chip 108 (e.g., die or packaged die) may be connected to the disk memory 104 via the chip or system bus 102. The integrated circuit chip 108 may include, for example, an input/output stage 110, cache memory 112, register files 114 and one or more execution units 116. Control logic 118 provides control of the various stages to effect processing. Active memory circuits (e.g., that are made from CMOS transistors or other active memory structures) in the form of flip-flops 120, for example, may be used to store information throughout the integrated circuit as well. Other memory circuits such as the register file, as known in the art, may store state elements for computations for the execution unit. The flip-flops 120 store states of the processor and the cache memory 112 may be SRAM cache or other suitable volatile memory cache. Memory circuits such as flip-flops, registers, register files, SRAM and other memory circuits that store state information can be quite voluminous particularly in complex processors such as CPUs, GPUs and other processors. Memory circuits as used herein include, for example, active memory circuits that employ, for example, active transistors such as CMOS transistors or other suitable active devices. The flip-flops 120 may be connected to scan chains that are used for testing the integrated circuit prior to packaging and may also be used to scan out state information from various circuits in the chip prior to power down as known in the art. The scan chains may typically operate at a low frequency such as 100 MHz and typically scan out state data in a serialized fashion which can take an inordinate amount of time. The state information may be saved onto the non-volatile disk 104. Once stored, power to the section of the chip or system can be removed. This is sometimes referred to as power gating.

To restore the state, the reverse process is executed. The section of the chip, entire chip or system is powered up and the state is restored to its previous state from the save location and execution is resumed from the previous store point. Such state saving techniques can require significant amounts of power to save and restore the state of entire sections of a chip, the entire chip or system. This can defeat the purpose of power gating in an integrated circuit which allows the reduction or removal of power from subsections or portions of the chip to save power when they are not in use or otherwise slow down the operation to conserve power. Such power gating is useful for mobile devices for example. Such power gated integrated circuits may be used, for example, in handheld devices such as smart phones, laptops, tablet devices or any other suitable mobile devices. Energy efficiency is becoming more commonplace in non-mobile devices as well.

It is also known in the art to use shadow flip-flops that are active circuits that are connected to active flip-flops to attempt to save state. However, shadow flip-flops are typically connected to a separate supply voltage to keep the flip-flop on during power gating so that the data is not lost. This results in additional leakage current from the many shadow flip-flops that are employed to save state, drawing unnecessary power and adding unnecessary temperature increases.

Also, servers and other apparatus employ integrated circuits that store system state information for differing virtual machines wherein each virtual machine is used by a different operating system instance or operating system. A hypervisor, as known in the art, is a virtual machine monitor that may be a piece of executing software that performs hardware platform virtualization that allows multiple operating systems to run on a host computer concurrently. Such systems may save state information and restore state information depending upon a virtual machine operation. However, such state saving technology can result in a laborious process. For example, storing a system may involve flushing a processing pipe, achieving a stable state and explicitly storing the state into off-chip persistent memory such as flash memory or onto an off-chip persistent memory in the form of a hard drive. This process may consume dozens of cycles of flushing the processing pipe and hundreds more cycles saving the associated state information. This assumes that the system switching can occur within the same operating system context. If a system with operating system contexts must also be stored to invoke a new system, then the delay can be even larger.

There is also a reliability mechanism called check pointing, which is used to save system state in order to provide a restart operation point if a program execution fails. The check point provides a restart point that is in many ways another version of a stored context or virtual system.

As noted above, one or more processor execution pipelines execute instructions and access the register file to save intermediate information or final information from the execution pipeline. Other miscellaneous architectural state information may be distributed throughout the integrated circuit such as in registers or flip-flops that store various information. A memory controller allows the processor execution pipeline to save and restore state information to/from off-chip flash memory or hard drive which is a persistent memory store of state information programs and data information depending upon the device or system. If the data is to be stored to off-chip persistent memory, the memory controller may store the cached state information to off-chip memory. The state store operation which may employ, for example, special software, typically stores the state information bit by bit which can be a slow lengthy process using the memory controller. The use of the off-chip persistent flash memory typically has slow write characteristics and storing the state information can add an undesirable delay when an integrated circuit is to be awakened from a sleep state or when entering a sleep state. Also, slow switching between virtual machines and storing state information in off-chip persistent memory can have an adverse impact on processor performance.

Accordingly, a need exists for an improved processor state store and restore method and apparatus.

BRIEF DESCRIPTION OF THE DRAWINGS

The invention will be more readily understood in view of the following description when accompanied by the below figures and wherein like reference numerals represent like elements, wherein.

DETAILED DESCRIPTION OF THE PREFERRED EMBODIMENTS

Briefly, a method and apparatus for controlling state information retention determines at least a state information save or restore condition for at least one processing circuit such as one or more CPU or GPU cores or pipelines, in an integrated circuit. In response to determining the state information save or restore condition, the method and apparatus controls either or both of saving or restoring of state information for different virtual machines operating on the processing circuit, into corresponding on-die persistent passive variable resistance memory. The state information save or restore condition is a virtual machine level state information save or restore condition. State information for each of differing virtual machines is saved or restored from differing on-die passive variable resistance memory cells that are assigned on a per-virtual machine basis.

In one example, a method and apparatus determines whether to save or restore virtual machine state information to a corresponding on-die passive variable resistance memory or to instead store state information to off-die memory, based on virtual machine priority information, such as a quality of service policy associated with a given user, or application for a given processing circuit in the integrated circuit. The determination may also be based on whether a particular virtual machine is likely to be activated before another virtual machine, or based on any other suitable priority basis.

Also, in one embodiment, new save and restore instructions are employed that may be executed, for example, by a processor such as a CPU core or GPU core which includes a save or restore command along with on-die PVRM non-volatile state storage identification data.

Among other advantages, power savings can result from reduced switching time from wakeup and shutdown operations for power gating when using virtual machines as well as providing quality of service distinctions among applications or users of a server or other device by allowing large amounts of state information from different virtual machines to be backed up on-chip during non-power gating operation as well as efficiency improvements due to reduction of clock cycles used to transfer state information to and from off-chip non-volatile memory.

Figure 1:
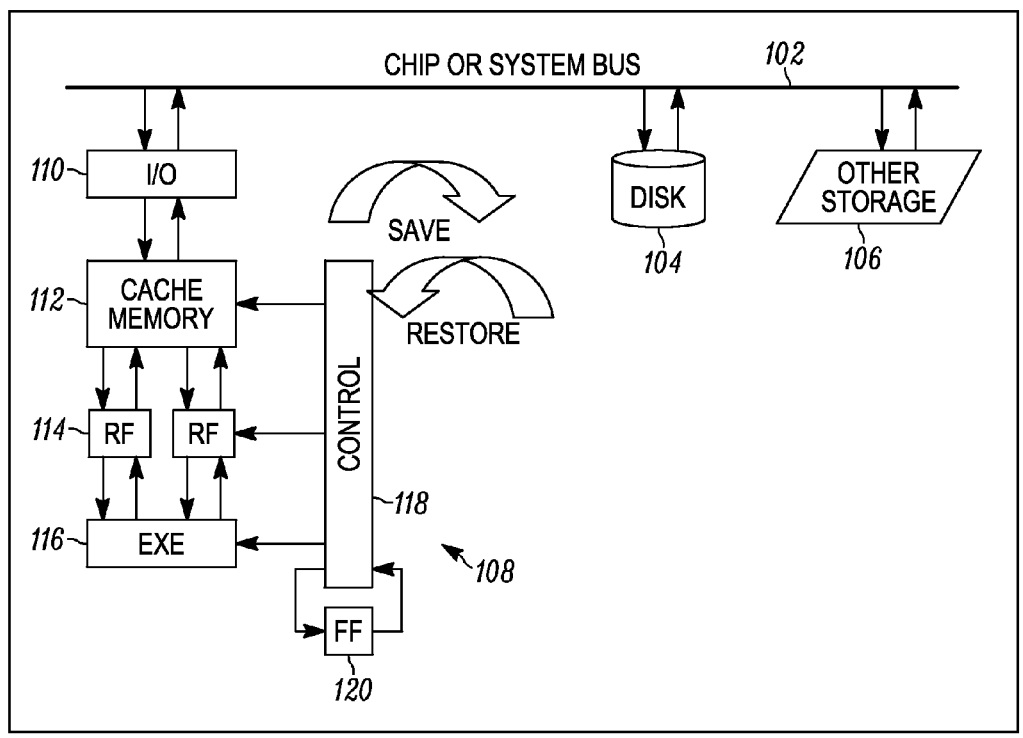
FIG. 1 is a block diagram illustrating one example of a prior art system that employs a state saving operation.
Figure 2:
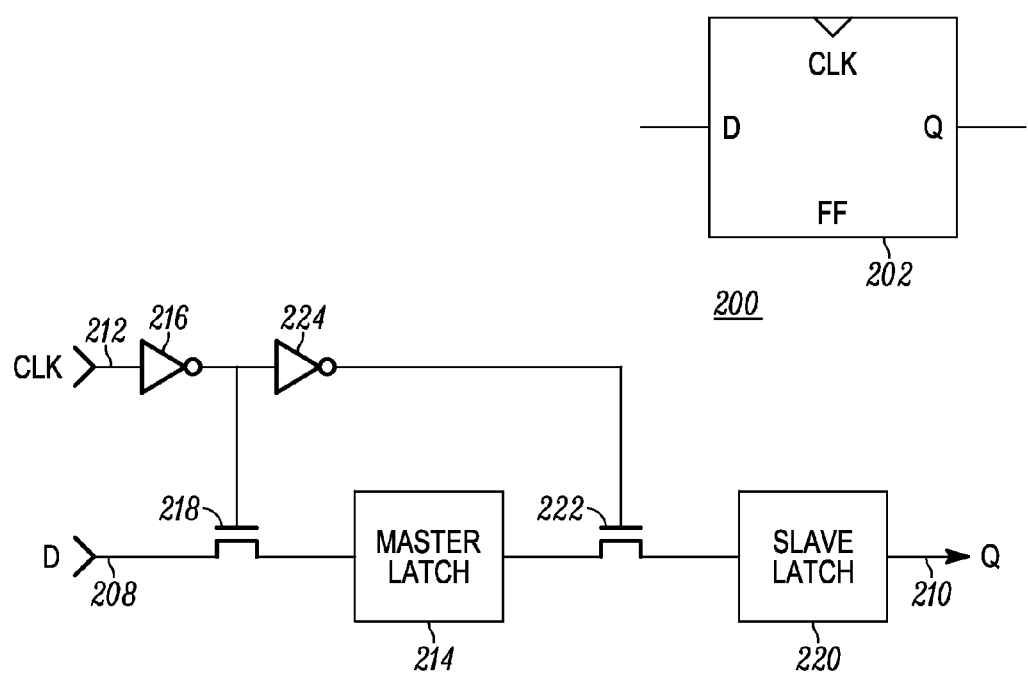
FIG. 2 is a block diagram illustrating one example of a prior art flip-flop.

FIG. 2 illustrates a prior art flip-flop circuit 200 made with active devices as known in the art. A block diagram of the flip-flop is shown as block 202. The active memory circuit 200, in this case a flip-flop, receives input data 208 on an input of the memory circuit and generates an output Q 210. A clock input 212 clocks the data into a master latch 214 through an inverter 216 and a switch transistor 218 as known in the art. A slave latch 220 has an input connected to the output of the master latch through a second switch transistor 222 that receives the output from a second inverter 224 as known in the art. The switch transistor 222 passes output data from the master latch 214 based on the clock input signal 212 to the slave latch 220. The clock signal 212 may be generated by any suitable clock source as known in the art.

Figure 3:
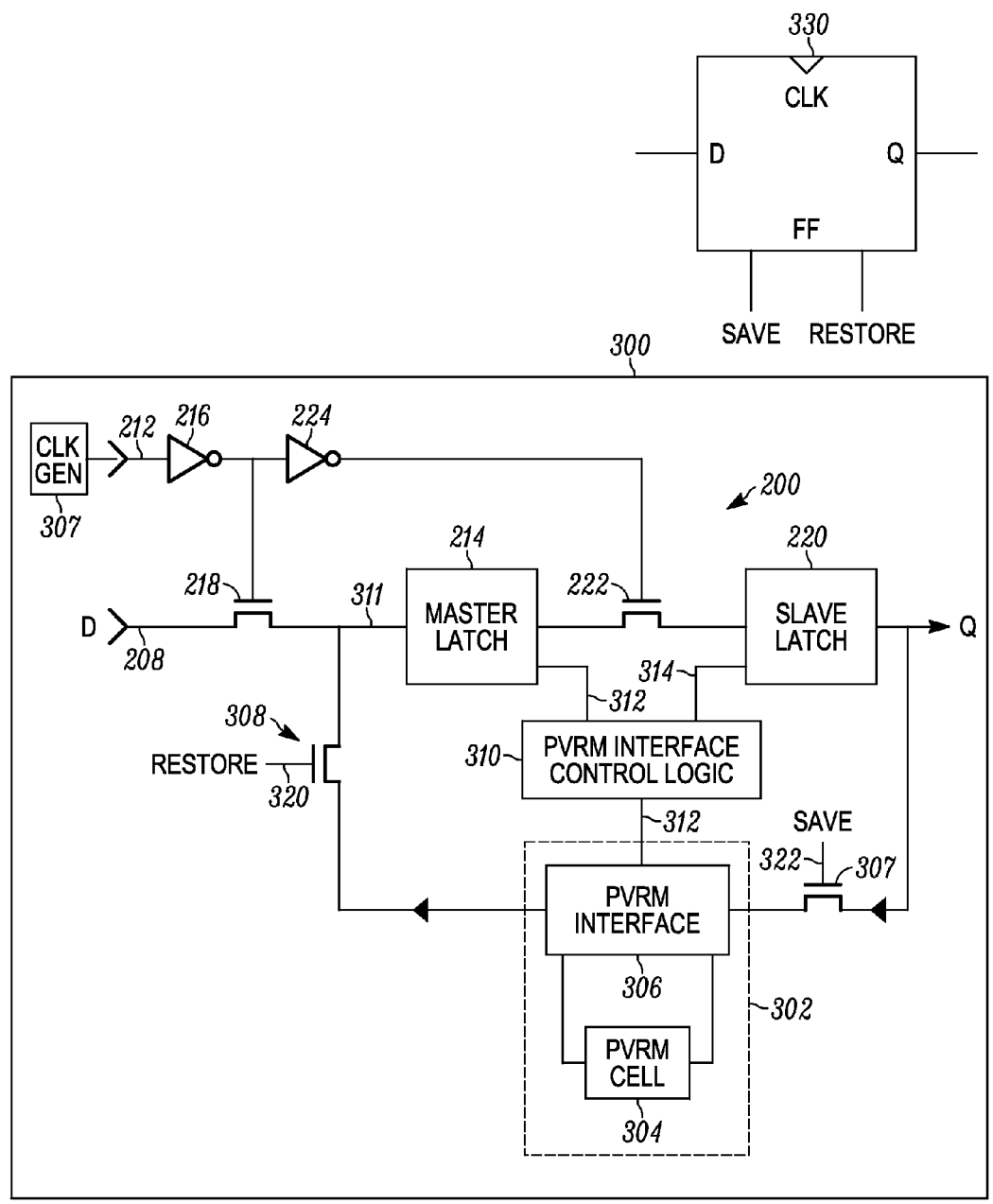
FIG. 3 is a block diagram illustrating one example of an integrated circuit employing a memory state backup circuit in accordance with one example set forth in the disclosure.

FIG. 3 illustrates one example of an integrated circuit 300 employing an active memory circuit 200, in this example a flip-flop of the type shown in FIG. 2 and at least one memory state backup circuit 302 that is connected to the active memory circuit 200. The memory state backup circuit 302 includes at least one passive variable resistance memory (PVRM) cell 304 which in this example is illustrated as being a 1 bit cell, and at least one PVRM cell interface 306 that is coupled to the active memory circuit in this example through a save switch 307 and restore switch 308. The switches are shown to be active CMOS transistors, but passive variable resistance switches may also be used. The PVRM cell interface 306 and PVRM cell 304 backup data from the active memory circuit 200. The PVRM cell interface 306 controls reads and writes (e.g., the setting of a resistance value and sensing thereof) to the PVRM cell to back up data from the active memory circuit 200 to the PVRM cell 304. The integrated circuit 300 also includes PVRM cell interface control logic 310 that provides a power control signal 312 to the PVRM cell interface 306 to remove power to the PVRM cell after backup of the data from the active memory circuit to the PVRM cell. The PVRM cell interface control logic 310 may be made from active circuits such as transistors, state machines, programmed processors or any suitable logic to operate as described herein. In operation, the PVRM cell interface control logic 310 also may control power (e.g., remove or add) to the slave latch and master latch shown by power control signals 312 and 314 or other logic in the circuit if desired. However, separate power control logic may be employed if desired.

FIG. 3 illustrates a clock circuit 307 that is coupled to the input of the switch 222 provide clocking of the switch. The clock circuit may be any suitable clock generation circuit as known in the art.

The PVRM interface 306 controls the PVRM cell to store a logical 1 when the save switch is closed and Q is a logical 1 and stores a 0 if Q is 0. Other logic levels may also be used. For example, since the PVRM cell is a passive resistance structure, the single cell can be used to represent multiple values or states.

The restore switch 308 is coupled to an input 310 of the active memory circuit, in this example to the input of master latch 214 and to an output of the PVRM cell interface 306. The restore switch 308 is responsive to a restore signal 320 to cause the backup data in the PVRM cell to be input to the active memory circuit (e.g., the master latch). The PVRM interface reads out the PVRM value when the restores witch 308 is active. The save switch 307 is coupled to an output of the active memory circuit 200 and in this case, is coupled to the output of slave latch 220 and is also coupled to an input of the PVRM interface 306. The save switch is responsive to a backup signal 322 to pass data from the active memory circuit for example stored in slave latch 220 to PVRM cell 304. The control signals such as the save signal 322 and the restore signal 320 may be generated by any suitable control logic such as a processor executing a software application on the integrated circuit 300, dedicated hardware that automatically controls the state store operation during power gating, or any other suitable control mechanism. FIG. 3 also illustrates a diagrammatic representation 330 of the circuit shown illustrating a new flip-flop circuit with a built-in non-volatile state store mechanism which in this example is done with a passive memory circuit configuration.

The passive variable resistance memory cell 304 may be formed by thin-film deposition techniques such as CVD, thermal evaporation, sputtering, MBE, electroplating, spin-coating, or any other suitable techniques. The material of the passive variable resistance memory cell may be any suitable variable resistance material that is capable of storing state by resistance. Depending on the specific type of passive variable resistance memory, the material of the passive variable resistance memory layer may include, for example, one or more thin-film oxides (e.g., $TiO_2$, $SiO_2$, NiO, $CeO_2$, $VO_2$, $V_2O_5$, $Nb_2O_5$, $Ti_2O_3$, $WO_3$, $Ta_2O_5$, $ZrO_2$, IZO, ITO, etc.) for memristors, chalcogenide for phase-change memory, and ferromagnetic materials (e.g., CoFeB incorporated in MgO) for magnetoresistive memory.

It is known in the art that memory may be implemented by an array of memory cells. Each memory cell of the array includes a memory region as a place to store state, which represents one bit of information. In order to access each memory cell, the array of memory is organized by rows and columns, and the intersection point of each row-column pair is a memory region. The rows are also called word lines, whereas the columns are named bit lines.

In this example embodiment, the passive variable resistance memory cell 304 (e.g. one bit) may be a memristor of any suitable design. The passive variable resistance memory cell in this example embodiment, is implemented as a memory layer including a memristor passive variable-resistive memory cell (e.g., each 1 bit) and may be of any suitable design. Since a memristor includes a memory region (e.g., a layer of $TiO_2$) between two metal contacts (e.g., platinum wires), memristors could be accessed in a cross point array style (i.e., crossed-wire pairs) with alternating current to non-destructively read out the resistance of each memory cell. A cross point array is an array of memory regions that can connect each wire in one set of parallel wires to every member of a second set of parallel wires that intersects the first set (usually the two sets of wires are perpendicular to each other, but this is not a necessary condition). The memristor disclosed herein may be fabricated using a wide range of material deposition and processing techniques. One example is disclosed in corresponding U.S. Patent Application Publication No. 2008/0090337, having a title "ELECTRICALLY ACTUATED SWITCH", which is incorporated herein by reference.

In this example, first, a lower electrode is fabricated above the actual memory cell using conventional techniques such as photolithography or electron beam lithography, or by more advanced techniques, such as imprint lithography. This may be, for example, a bottom wire of a crossed-wire pair. The material of the lower electrode may be either metal or semiconductor material, preferably, platinum.

In this example, the next component of the memristor to be fabricated is the non-covalent interface layer, and may be omitted if greater mechanical strength is required, at the expense of slower switching at higher applied voltages. In this case, a layer of some inert material is deposited. This could be a molecular monolayer formed by a Langmuir-Blodgett (LB) process or it could be a self-assembled monolayer (SAM). In general, this interface layer may form only weak van der Waals-type bonds to the lower electrode and a primary layer of the memory region. Alternatively, this interface layer may be a thin layer of ice deposited onto a cooled substrate. The material to form the ice may be an inert gas such as argon, or it could be a species such as $CO_2$. In this case, the ice is a sacrificial layer that prevents strong chemical bonding between the lower electrode and the primary layer, and is lost from the system by heating the substrate later in the processing sequence to sublime the ice away. One skilled in this art can easily conceive of other ways to form weakly bonded interfaces between the lower electrode and the primary layer.

Next, the material for the primary layer is deposited. This can be done by a wide variety of conventional physical and chemical techniques, including evaporation from a Knudsen cell, electron beam evaporation from a crucible, sputtering from a target, or various forms of chemical vapor or beam growth from reactive precursors. The film may be in the range from 1 to 30 nanometers (nm) thick, and it may be grown to be free of dopants. Depending on the thickness of the primary layer, it may be nanocrystalline, nanoporous or amorphous in order to increase the speed with which ions can drift in the material to achieve doping by ion injection or undoping by ion ejection from the primary layer. Appropriate growth conditions, such as deposition speed and substrate temperature, may be chosen to achieve the chemical composition and local atomic structure desired for this initially insulating or low conductivity primary layer.

The next layer is a dopant source layer, or a secondary layer, for the primary layer, which may also be deposited by any of the techniques mentioned above. This material is chosen to provide the appropriate doping species for the primary layer. This secondary layer is chosen to be chemically compatible with the primary layer, e.g., the two materials should not react chemically and irreversibly with each other to form a third material. One example of a pair of materials that can be used as the primary and secondary layers is $TiO_2$ and $TiO_{2-x}$, respectively. $TiO_2$ is a semiconductor with an approximately 3.2 eV bandgap. It is also a weak ionic conductor. A thin film of $TiO_2$ creates the tunnel barrier, and the $TiO_{2-x}$ forms an ideal source of oxygen vacancies to dope the $TiO_2$ and make it conductive.

Finally, the upper electrode in the passive variable resistance memory layer is fabricated on top of the secondary layer in a manner similar to which the lower electrode was created. This may be, for example, a top wire of a crossed-wire pair. The material of the lower electrode may be either metal or semiconductor material, preferably, platinum. If the memory cell is in a cross point array style, an etching process may be necessary to remove the deposited memory region material that is not under the top wires in order to isolate the memory cell. It is understood, however, that any other suitable material deposition and processing techniques may be used to fabricate memristors for the passive variable-resistive memory. It will also be recognized that any other suitable passive variable resistance technology may be employed as mentioned above or that the order of operation may be rearranged in any suitable manner.

It will be understood that PVRM is a term used to describe any memory technology that stores state in the form of resistance instead of charge. That is, PVRM technologies use the resistance of a cell to store the state of a bit, in contrast to charge-based memory technologies that use electric charge to store the state of a bit. PVRM is referred to as being passive due to the fact that it does not require any active semiconductor devices, such as transistors, to act as switches. These types of memory are said to be "non-volatile" due to the fact that they retain state information following a power loss or power cycle. Passive variable resistive memory is also known as resistive non-volatile random access memory (RNVRAM or RRAM).

Examples of PVRM include, but are not limited to, Ferroelectric RAM (FeRAM), Magnetoresistive RAM (MRAM), Memristors, Phase Change Memory (PCM), and Spin-Torque Transfer MRAM (STT-MRAM). While any of these technologies may be suitable for use in the IC 102 disclosed herein, PCM, memristors, and STT-MRAM are contemplated as providing an especially nice fit and are therefore discussed below in additional detail.

Phase change memory (PCM) is a PVRM technology that relies on the properties of a phase change material, generally chalcogenides, to store state. Writes are performed by injecting current into the storage device, thermally heating the phase change material. An abrupt shutoff of current causes the material to freeze in an amorphous state, which has high resistivity, whereas a slow, gradual reduction in current results in the formation of crystals in the material. The crystalline state has lower resistance than the amorphous state; thus a value of 1 or 0 corresponds to the resistivity of a cell. Varied current reduction slopes can produce in-between states, allowing for potential multi-level cells. A PCM storage element consists of a heating resistor and chalcogenide between electrodes, while a PCM cell is comprised of the storage element and an access transistor.

Memristors are commonly referred to as the "fourth circuit element," the other three being the resistor, the capacitor, and the inductor. A memristor is essentially a two-terminal variable resistor, with resistance dependent upon the amount of charge that passed between the terminals. Thus, a memristor's resistance varies with the amount of current going through it, and that resistance is remembered even when the current flow is stopped.

Spin-Torque Transfer Magnetoresistive RAM (STT-MRAM) is a second-generation version of MRAM, the original of which was deemed "prototypical" by the International Technology Roadmap for Semiconductors (ITRS). MRAM stores information in the form of a magnetic tunnel junction (MTJ), which separates two ferromagnetic materials with a layer of thin insulating material. The storage value changes when one layer switches to align with or oppose the direction of its counterpart layer, which then affects the junction's resistance. Original MRAM required an adequate magnetic field in order to induce this change. This was both difficult and inefficient, resulting in impractically high write energy. STT-MRAM uses spin-polarized current to reverse polarity without needing an external magnetic field. Thus, the STT technique reduces write energy as well as eliminating the difficult aspect of producing reliable and adequately strengthen magnetic fields. However, STT-MRAM, like PCM, requires an access transistor and thus its cell size scaling depends on transistor scaling.

Figure 4:
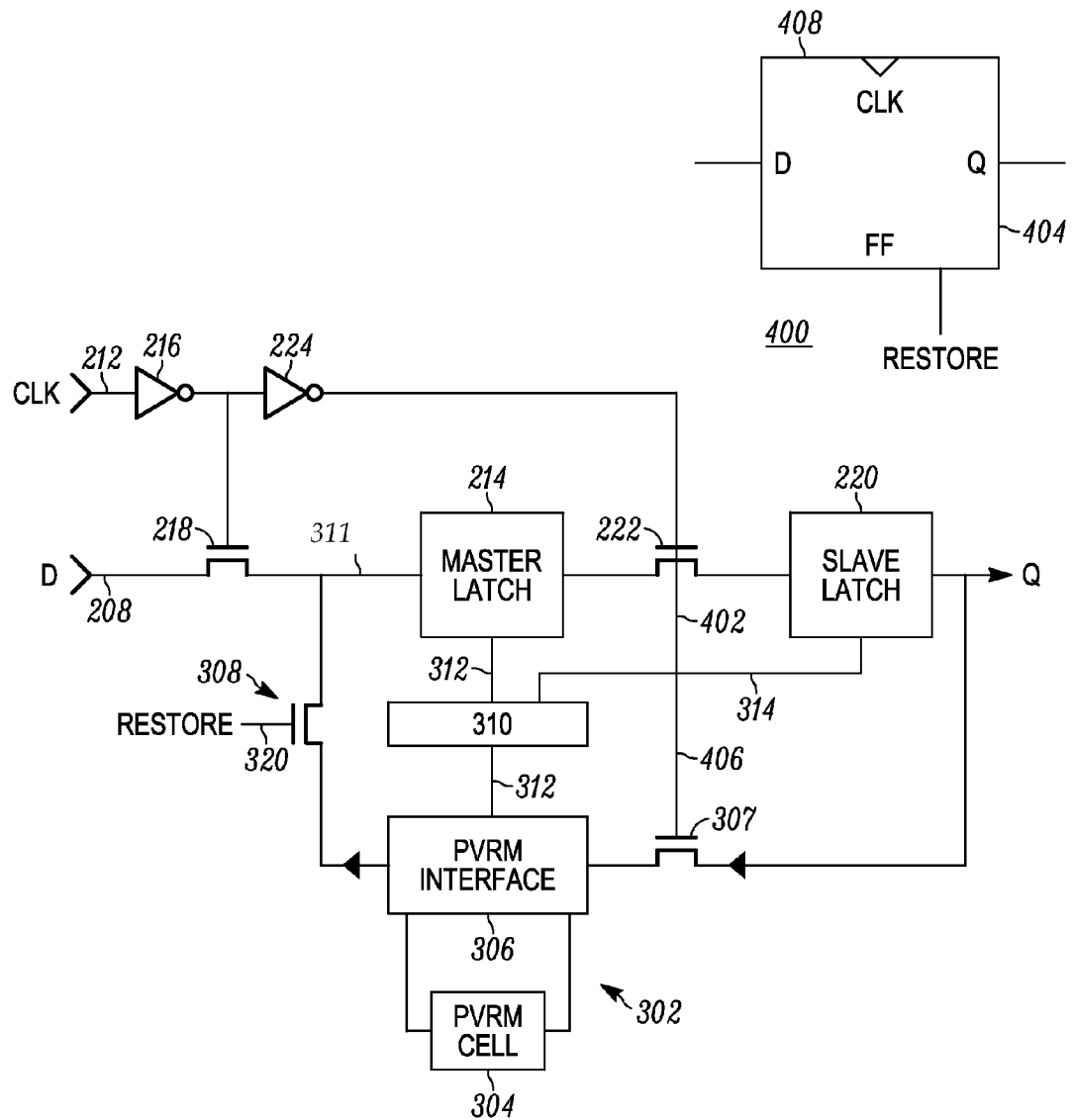
FIG. 4 is a block diagram of a portion of an integrated circuit in accordance with one example set forth in the disclosure.

FIG. 4 illustrates an integrated circuit 400 that employs a memory circuit, in this example a flip-flop that includes a direct backup wherein the output Q is always backed up automatically by the memory state backup circuit 302. In this example, the restore switch 302 which is connected to the input of the active memory circuit, in this case master latch 214, is also connected to an output of the PVRM interface 306. The restore switch 308 is responsive to restore signal 320 to cause the backup data in the PVRM cell 304 to be passed to the input of the master latch 214. The save switch 307 is configured in a different manner from that in FIG. 3. In this example, the save switch 307 has an input 406 that receives the clock signal 212 to clock the output Q of the flip-flop, in this example, out of slave latch 220, into the PVRM cell automatically. The save switch 307 automatically selects output data from an active memory circuit in response to output data being stored in the active memory circuit via clock signal 212. As such, the memory circuit is always backed up and ready to be power gated. The restore operation is still required once power is resumed. Block diagram representation 408 represents a flip-flop requiring only a restore input that includes self activation backup operation.

Figure 5:
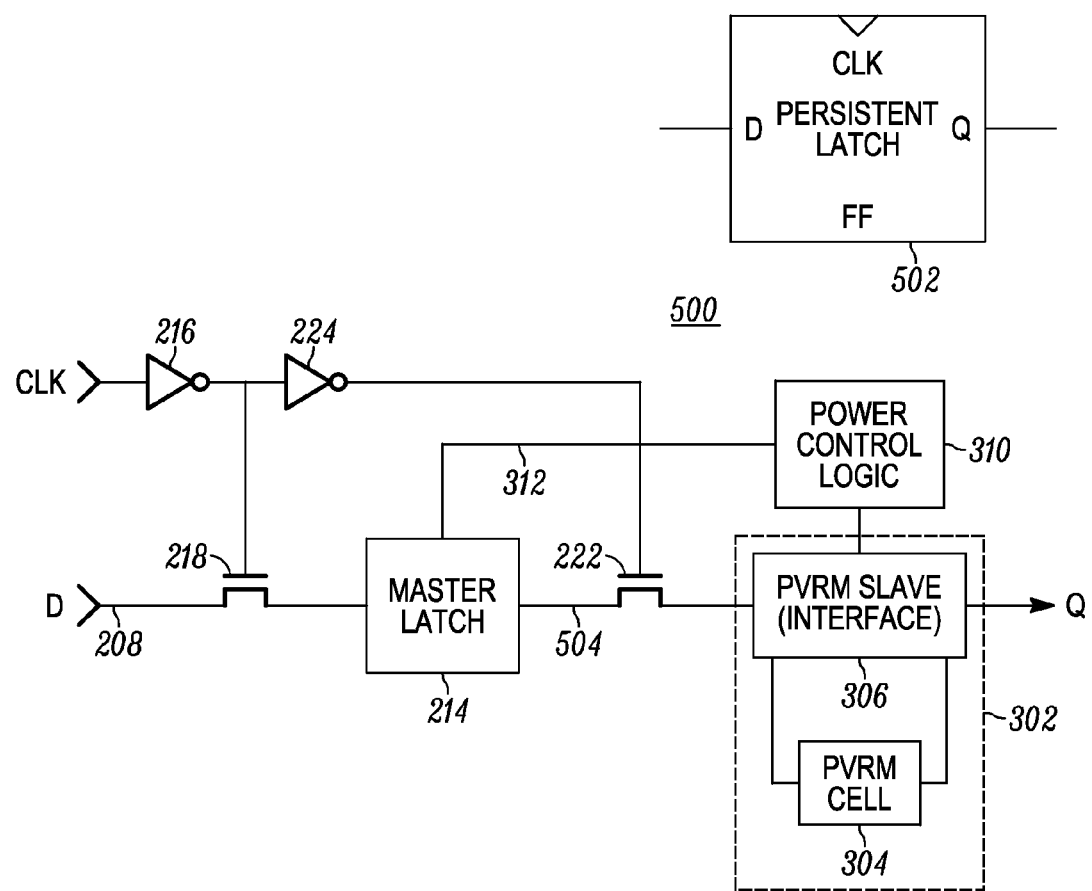
FIG. 5 is a block diagram of a portion of an integrated circuit in accordance with one example set forth in the disclosure.

FIG. 5 illustrates another example of an integrated circuit 500 employing an active memory circuit (an active master latch stage 214) and a passive variable resistance memory slave stage 302 coupled to an output of the active master latch 214 wherein the output is shown as 504. In this example, switch transistor 222 connects the active master latch stage and the passive variable resistance memory slave latch stage. As previously noted, the master latch is made of active CMOS devices or other active devices whereas the PVRM cell is made of a passive variable resistance construction. The PVRM interface 306 in this example is controlled by the switch transistor 222 such that when the output of the master latch is passed via the switch 222, the PVRM interface stores the logic level in the PVRM cell 304. The switch 222 is interposed between the active master latch stage 214 and the passive variable resistance memory slave latch stage 302. The PVRM slave latch stage includes a PVRM cell interface 306 coupled to the switch 222 as well as a PVRM cell 304 coupled to the PVRM cell interface as previously described. The PVRM slave stage stores data such as on the output 504 from the active master latch, in response to clocking of the switch 222 by clock signal. The PVRM slave latch stage 3020 stores the data in a non-volatile manner. As such, a PVRM cell is incorporated into the latch structure itself such that the state is always written to the local non-volatile PVRM cell. Power can be removed and restored at any time.

Figure 6:
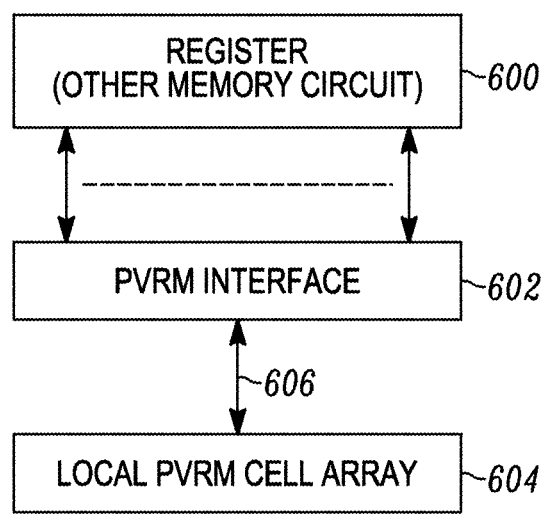
FIG. 6 is a block diagram generally illustrating a register with a memory state backup circuit in accordance with one example set forth in the disclosure.

Although simple flip-flops have been illustrated by way of example, the structures described herein may be applied to a wide variety of memory circuits such as register files that include registers and any other suitable memory circuits. By way of example, FIG. 6 illustrates a register 600 that may include a number of bits wherein each bit is stored in the PVRM cell array 604 which includes an array of bit cells of PVRM non-volatile structures. The PVRM interface 602 instead of simply passing a single bit may read and write a plurality of bits depending upon the size of the register 600. Depending on the size of the memory circuit, an array of rows and columns of PVRM cells may be used.

FIG. 6 illustrates a register that includes a plurality of active memory circuits that form the register as known in the art and also includes a plurality of passive variable resistance memory cells that form a cell array 604. The PVRM cell interface 602 controls reads and writes 606 to each of the PVRM cells to facilitate data backup from the plurality of active memory circuits in the register 608.

Figure 7:
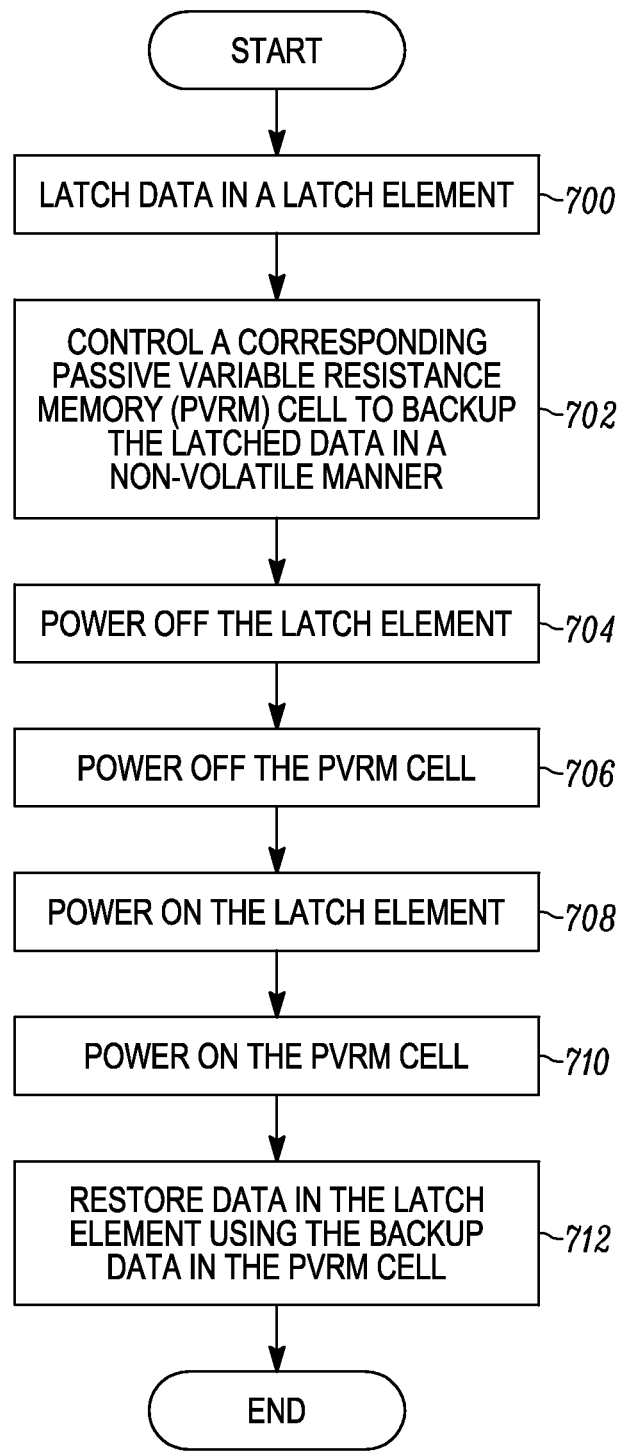
FIG. 7 is a flowchart illustrating one example of a method for providing state backup in an integrated circuit in accordance with one example set forth in the disclosure.

FIG. 7 illustrates a method for providing state backup in an integrated circuit such as the circuits described above. In block 700, the method includes latching data in an active memory circuit such as in master latch 214 via suitable clock signals. As shown in block 702, the method includes controlling a corresponding passive variable resistance cell 304 to backup the latch data (queue), in a non-volatile manner. As such, when power is removed from the PVRM cell, the cell maintains the value of the data. The method includes, as shown in block 704, powering off the active memory circuit such as master latch 214 and slave latch 220 if desired as well as inverters and any other suitable logic in the memory circuit. The method includes powering off the PVRM cell 304 via, for example, the PVRM interface via the PVRM memory control logic 310. When data is to be restored, the method includes powering on the active memory circuit, powering on the PVRM cell and restoring data in the active memory circuit using the backup data in the PVRM cell as shown in blocks 708, 710 and 712. It will be recognized that the ordering of the steps may be in any suitable order and that the order given above is merely an example.

The method may include controlling a corresponding passive variable resistance memory cell to backup the latch data by generating a backup signal to control reading of the data from the active memory circuit to be stored in the PVRM cell. Restoring data in the active memory circuit may include using the backup data in the PVRM cell by generating a restore signal to cause the backup data from the PVRM cell to be input to the active memory circuit such as performed by the circuit in FIG. 3.

Among other benefits of this embodiment, simplified power gating may be employed on a circuit, system level or integrated circuit level as there is no need to provide methods and paths to read the state of each flip-flop, register file and SRAM. Instead, when the clock is stopped to a flip-flop, for example, the data in the active memory circuit is captured in the co-resident passive variable resistance memory cell and power can be removed to the circuit. In order to return to the operational state, the power can be turned back on for the flip-flop and the state of the co-resident passive variable memory cell can be immediately written to the memory circuit and the clock can be started again. The resulting operation can be much faster than conventional techniques and more efficient allowing power savings over smaller intervals of time and may be easier to implement since the passive variable resistance cell can be built as co-resident with a flip-flop within an integrated circuit. In addition, power to the passive variable resistance memory cells can also be removed providing additional power savings. Since the passive variable resistance state backup circuitry is located on-die, the power supply of the chip may be shut off without losing state information on a chip level. Other benefits will be recognized by those of ordinary skill in the art.

Figure 8:
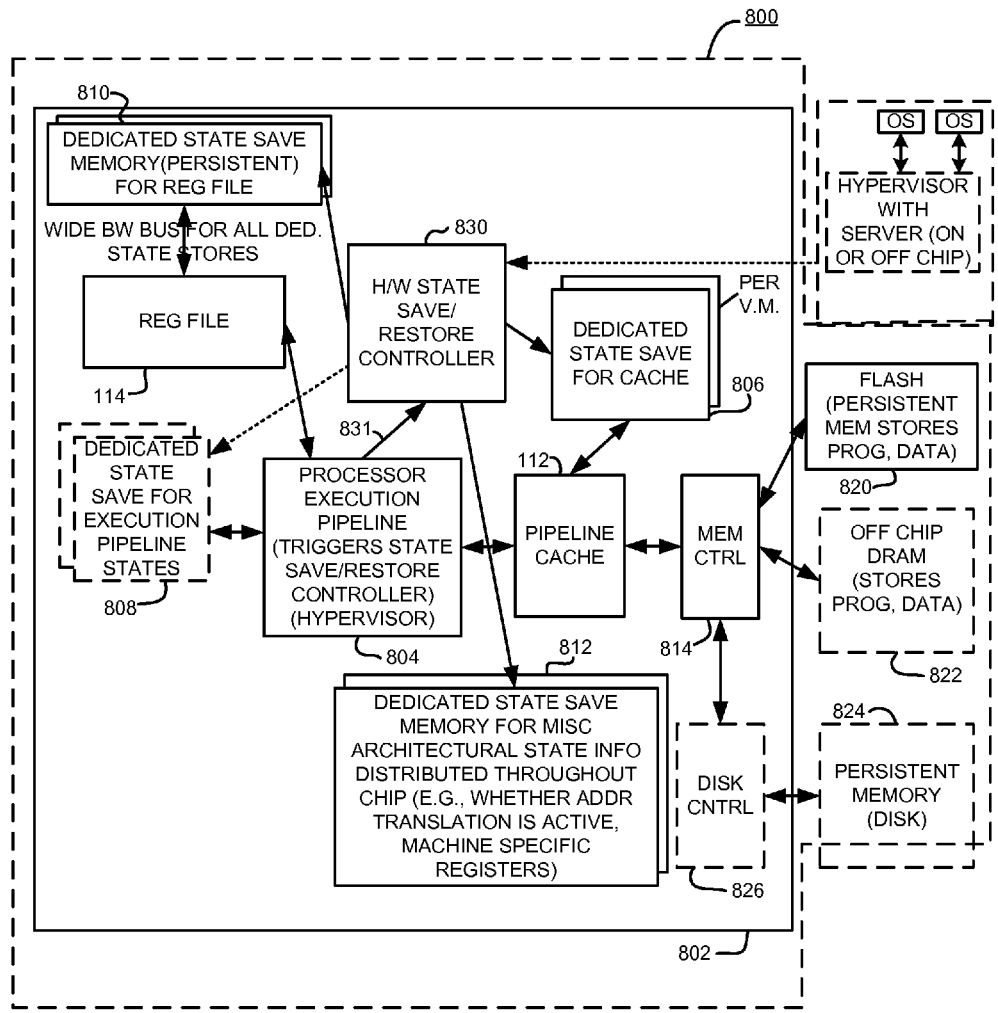
FIG. 8 is a block diagram of an apparatus of an integrated circuit die in accordance with one example set forth in the disclosure.

FIG. 8 is a block diagram illustrating one example of an apparatus 800 that employs per-virtual machine on-die persistent state store and restore control. In this example, the apparatus 800 will be described as being a server, however any suitable apparatus may be used. The apparatus 800 includes an integrated circuit 802 that includes processing circuit 804 such as, but not limited to, a processor execution pipeline such as those that may be found in CPU cores, GPU cores or any other suitable processor. By way of example only, a single CPU core will be described, however, any suitable number may be used. In addition, corresponding on-die passive variable resistance memory (PVRM) is on the die that is configured as dedicated on-die persistence state retention memory for state information associated with the processing circuit 804. The on-die passive variable resistance memory in this example is of the type described above and is shown in this example to be replicated (e.g., partitioned) for multiple virtual machines. In this example, PVRM memory is passive variable resistant persistent state memory 806 that is dedicated for the pipeline cache 112, passive variable resistant persistent state memory 810 dedicated for a register file 114 and passive variable resistant persistent state memory 812 dedicated for architectural state information. As illustrated, there are per-virtual machine PVRMs for the various state information. The PVRM memory may be a large block of PVRM memory whose different memory locations are allocated for different virtual memories or may be suitably configured as independent memory banks on a virtual memory basis if desired or may be distributed flops that are distributed throughout the die or any other suitable memory partition mechanism may be employed.

In this example, the processing circuit 804 (e.g., CPU core) executes hypervisor code and serves as a hypervisor. The hypervisor decides when to switch virtual machines as know in the art and instructs the controller 830 (control logic such as a state machine or other suitable logic) to save/restore information to the PVRM. This can be done using one or more instructions (see e.g. FIG. 11) or through any suitable mechanism.

The integrated circuit 802 also includes a memory controller 814 that is in communication with the pipeline cache 112 as known in the art to also provide off-die storage of state information using known techniques if desired. The memory controller 814 may be, for example, interfaced with flash memory 820, off-chip DRAM memory 822, hard drive 824 that is accessible through a disk controller 826 or other off-die memory as known in the art.

The integrated circuit also includes control logic 830 that controls either or both of saving or restoring of state information for different virtual machines operating on the processing circuit 804, into corresponding on-die passive variable resistance memory 806, 808, 810, and 812. This is done in response to a virtual machine level state information save or restore condition. In this example, the control logic 830 may be configured as a state machine, sub-processor, or any other suitable configuration.

The hypervisor and hence processing circuit 804 determines whether to save or restore state information for a given virtual machine to corresponding on-die passive variable resistance memory associated with a particular virtual machine or to the off-die memory 820, 822, 824 based on virtual machine priority information once the virtual machine level state information save or restore condition has been determined. By way of example and not limitation, a virtual machine level state information save or restore condition may occur when a new OS instance is to be executed. In response, the hypervisor needs to determine if another virtual machine may need to be placed in an effective temporary shutoff mode so that the new virtual machine which may have a higher priority can execute on the processor pipeline 804. Accordingly, priority information associated with a virtual machine may be, for example, data representing that a virtual machine is being run by an application that has a higher priority over an application being handled by another virtual machine. Differing software applications that are executing on the processor execution pipelines 804 may have different priorities depending upon a number of differing priority factors. These can include, but are not limited to for example, that an application is a real time application such as a video application compared to a non-real time application such as a word processing application. Another example in the case of a server may be that a certain level of quality of service has been sold by a service provider and is prepaid by a particular user so that the user gets priority when the user wishes to access the server. For example, if the server is used as a web server, a particular web client such as a bank or other client may have priority over another user of the server so that when the bank application wishes to execute on the processing circuitry 804 of the server, a higher priority is given to another client (i.e., and hence virtual machine) that has not paid for a higher quality of service. That application may then be temporarily shut down and its state information saved to corresponding virtual machine persistent on-die memory, namely the passive variable resistance memories that have been dedicated for storage of information for a particular virtual machine. Accordingly, the hypervisor may determine whether to save and/or restore state information. The controller 830, in response to save/restore control information 831 from the hypervisor 804 (e.g., save/restore ID that identifies which virtual machine and hardware state to save and/or restore) accesses a corresponding on-die passive variable resistance memory for a given virtual machine to allow either another virtual machine to operate or to move the state information to off-die memory. As such a virtual machine level state information save or restore condition may be indicated by the save/restore control information 831. This may be based on a quality of service policy, determining that a particular virtual machine would need to be restored sooner than another virtual machine or based on any other suitable criteria.

In operation, the control logic 830 controls the saving and/or restoring of state information to corresponding on-die passive variable resistance memory by managing, in one example, passive variable resistance memory state backup correlation data for a plurality of virtual machines. By way of example, a memory table is maintained by the control logic 830 which indicates which virtual machine is assigned to which passive variable resistance memory locations for each of the various backup persistent memories 806, 808, 810 and 812. If the on-die chip is configured with a PVRM memory configured to store state information persistently for all states, the memory may be partitioned on a per-virtual memory basis. Each partition is then controlled by the controller 830 to save or restore information for a given virtual machine depending upon which virtual machine needs to have its state information saved or restored. As previously noted, the control logic 830 may be a state machine to control the saving and/or restoring of the state information based on switching of use of the processing of the processor execution pipeline 804 by different operating system instances.

Figures 9, 10:
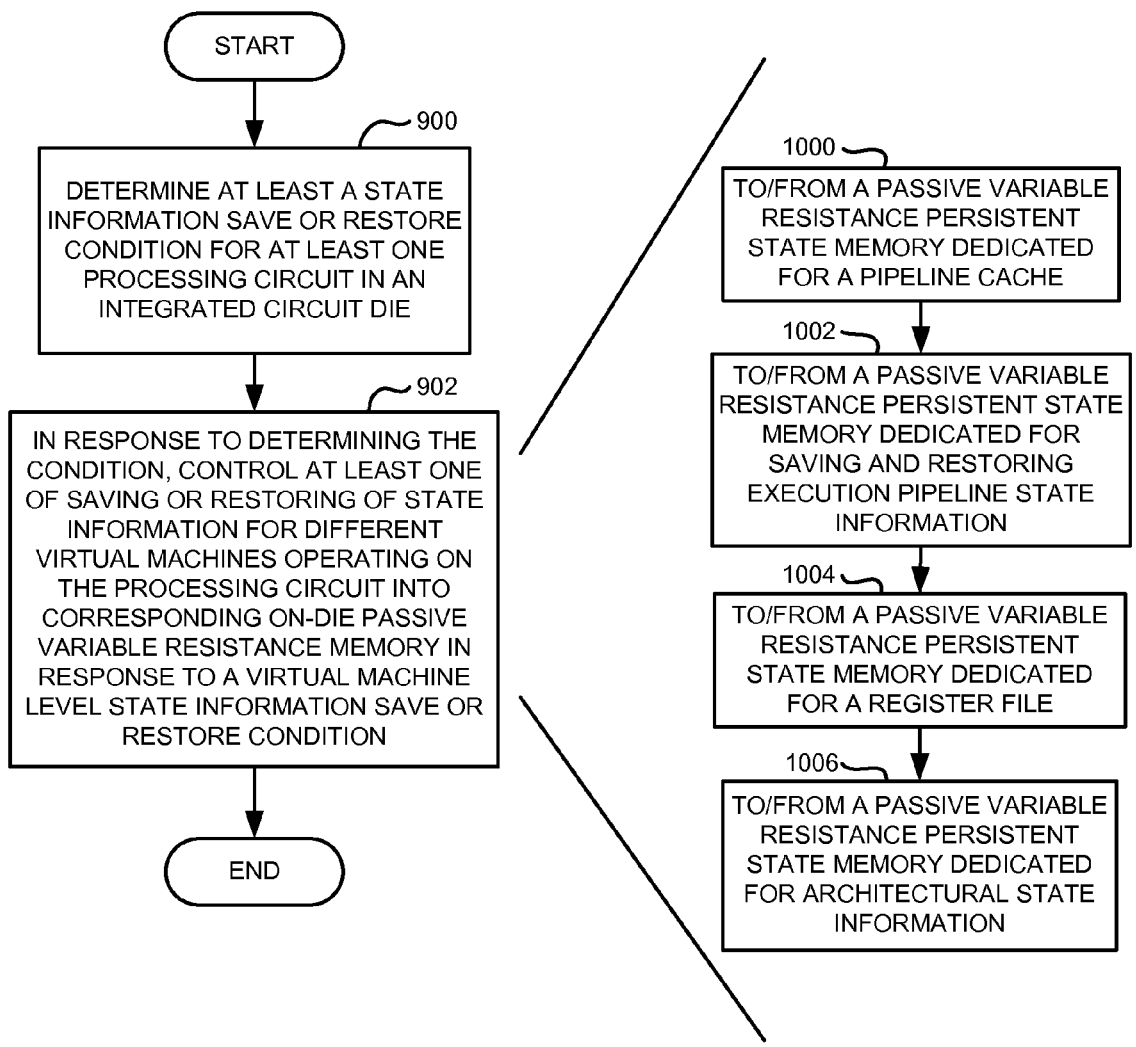
FIG. 9 is a flowchart illustrating one method for controlling state information retention in an apparatus in accordance with one example set forth in the disclosure.
FIG. 10 is a flowchart illustrating one method for controlling state information retention in an apparatus in accordance with one example set forth in the disclosure.

Referring also to FIGS. 9 and 10, methods are shown to illustrate one example of controlling per-virtual machine state information save and/or restore operations in accordance with one example. It will be recognized that although the methods described herein are described in a particular that any suitable order may be utilized and that certain operations within the disclosed processes need not be performed if desired. As shown in block 900, the method may be carried out, for example, by the processing circuit 804, or any other suitable structure. As shown, the method includes determining at least a state information save or restore condition for at least one processing circuit in an integrated circuit die. This may be done, for example, by the hypervisor based on any suitable data. For example, a same condition for a current virtual machine may be a condition occurring when an operating system instance desires to be initiated so that a new virtual machine can begin operation. The condition for a save operation may also be, for example, when an OS would like to stop operation or that the control logic determines that a particular virtual machine needs to temporarily save its state so that another virtual machine can restore its state and continue operation. Other conditions may be power gating conditions whereby, for example, a portion of the integrated circuit is required to be powered down resulting in the need to save state information to the persistent on-die memory or conversely, a portion of the die may need to be powered up requiring state information that is previously saved to be restored to continue operation of a virtual machine. A restore condition can occur when the hypervisor needs to switch back to a virtual machine that was temporarily shut down.

As shown in block 902, the method includes, in response to determining the state information save and/or restore condition (such as indicated by the save/restore ID data 831), controlling either saving or restoring of state information for different virtual machines operating on the processing circuit of the die. This may be done by the controller 830. The saved or restored information is saved, for example, into corresponding on-die passive variable resistance memory or retrieved from corresponding on-die passive variable resistance memory in response to a virtual machine level state information save or restore condition as noted above. The control logic 830 controls and manages the actual movement of data between the PVRM and the various other components of the processor chip. As such, a virtual machine level save and/or restore control is performed to save state information or retrieve state information from persistent passive variable resistance memory that is either configured as different memory partitions for differing virtual machines. To reduce latency, PVRM memory can be co-located above or in close proximity to the state store that is being backed up if desired.

FIG. 10 illustrates an example of controlling the saving and/or restoring of state information on a virtual machine level in PVRM cells. As shown in block 1000, the method may include controlling the saving or restoring of state information to or from a passive variable resistance persistent state memory dedicated for a pipeline cache such as PVRM cache 806. For example, if the pipeline cache 112 contains state information for a virtual machine, the control logic 830 may save the state machine into the PVRM cache 806 and similarly restore the information from PVRM cache 806 back to the pipeline cache 112 when the virtual machine needs to be reinitiated. As shown in block 1002, the method may also include, if desired, saving the state information for a given virtual machine to a PVRM memory dedicated for saving execution pipeline state information shown as PVRM 808. Similarly, restoring state information once saved in the PVRM 808 back to the processor execution pipeline 804 may be done on one of virtual memory is reinitiated. As shown in block 1004, the method may include saving state information to a PVRM 809 dedicated for the register file 114. If the same virtual machine then needs to be restarted, the state data that was saved may then be restored back to the register file 114 to allow continued execution by the virtual machine. As shown in block 1006, in a similar manner, architectural state information may be saved and/or restored to corresponding passive variable resistance persistent state memory 812.

Referring again to FIG. 8, the arrows shown in the figure indicate communication between the various functional blocks either through buses, software calls or other conventional communication techniques. The register file by way of example 114 may be connected to corresponding dedicated PVRM state memory 810 through a wide bandwidth bus to facilitate high bandwidth state save and restore operations. For a general case of a multiprocessor system, if another processor were to change a piece of data that is currently saved in the PVRM state save for the cache of a given VM, then when that state is later copied from PVRM back into the cache, it may not correctly reflect the changed data. If multiple VM's span multiple cores then a VM may switch between running and suspended/saved on all its cores simultaneously. Alternatively, all cross-invalidates in a multiprocessor system must also be applied to save copies of caches in PVRM. Other options will be recognized by one of ordinary skill in the art based on the teaching herein.

Figure 11:
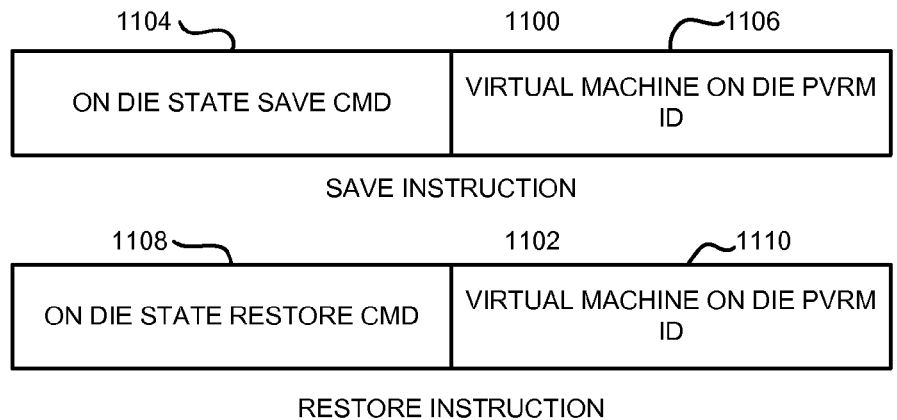
FIG. 11 is a diagram illustrating one example of a save instruction and restore instruction in accordance with one example set forth in the disclosure.

FIG. 11 illustrates diagrammatically a save instruction 1100 and a restore instruction 1102 that may be used and executed by the processing circuit 804 (e.g., hypervisor) in one embodiment. In another embodiment however, the control logic may simply respond to virtual machine conditions and power gating conditions to determine whether to save or restore information and may track the appropriate PVRM memory locations assigned to given virtual machines to determine where to save and restore information. However, where the system employs the unique commands 1100 and 1102, the operation includes executing the save state instruction 1100 that includes data 1104 that represents a save state command which may be any suitable number of bits, and the command also includes on-die PVRM identifier 1106 corresponding to one of a set of on-die PVRM memories that correspond to one of a plurality of differing virtual machines. Accordingly, utilizing a unique instruction set allows the virtual machine level on-die state retention operation to be implemented from an OS level, application level, firmware level or any other level that facilities instruction execution. The operation would also then include executing the restore state instruction 1102 that includes a restore command 1108 and an on-die PVRM identifier 1110 corresponding to one of a set of PVRM memories corresponding to one of a plurality of different virtual machines. The virtual machine ID indicates, for example, which virtual machine and hence which PVRM memory locations are affected by the restore command.

Figure 12:
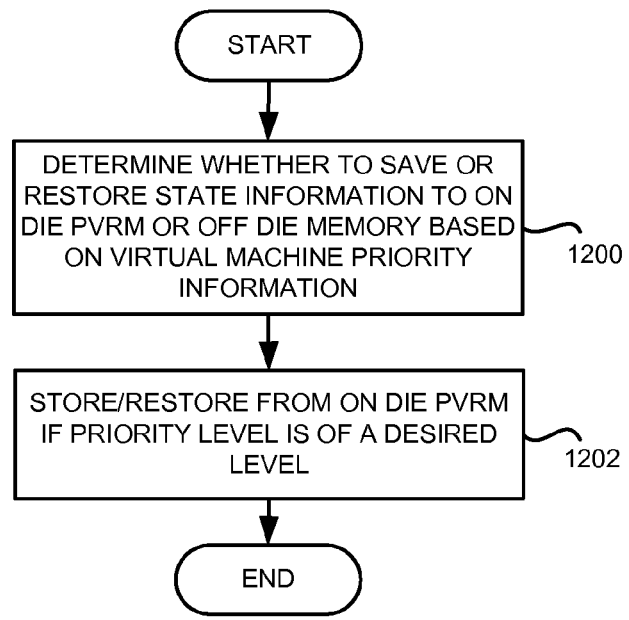
FIG. 12 is a flowchart illustrating one example of a method for controlling state information retention in an apparatus in accordance with one example set forth in the disclosure.

FIG. 12 illustrates one example of a method for controlling state information retention and apparatus taken from the perspective, for example, of the control logic implemented as a hypervisor. As shown in block 1200, the method includes determining whether to save or restore state information to on-die PVRM or off-die memory based on virtual machine priority information as described above. As indicated in block 1202, the method may include storing or restoring information from on-die PVRM if a priority level associated with a given virtual machine is of a desired level as previously described.

Figure 13:
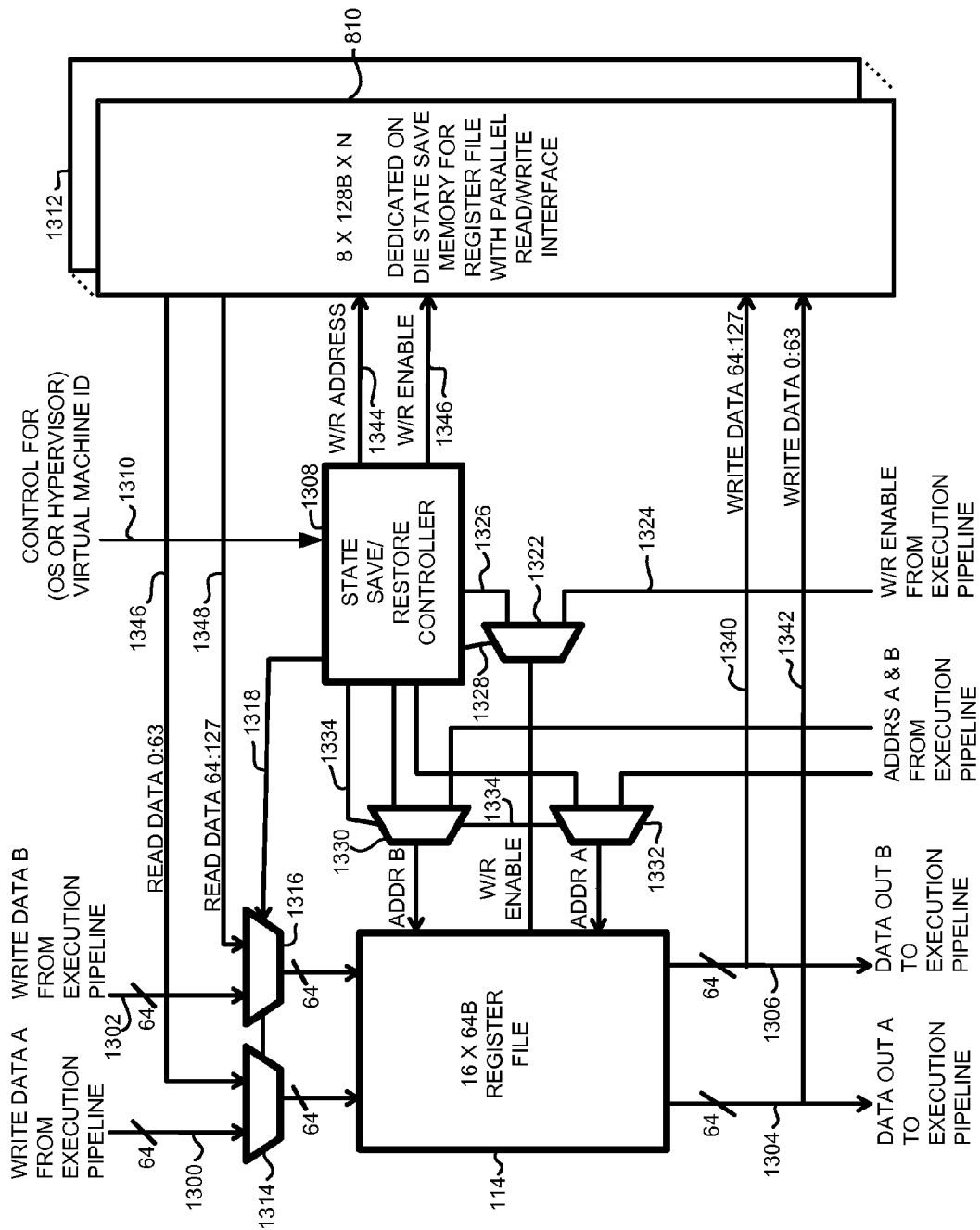
FIG. 13 is a block diagram of a portion of an integrated circuit die in accordance with one example set forth in the disclosure.

FIG. 13 is a block diagram illustrating one example of a portion of the integrated circuit die 802 and in particular, the dedicated on-die state PVRM 810 and corresponding logic to backup the register file. As shown, the register file 114 can receive write data from the execution pipeline 804 via lines 1300 and 1302 during normal operation and can provide data out to the execution pipeline through lines 1304 and 1306. State save/restore controller 1308 controls whether data from the register file 114 is saved to the dedicated on-die state save memory 810 or receives restore data from the PVRM memory 810 based on control data 1310 from control logic 830. In this example, control data 1310 indicates not only whether data is to be saved or restored, but also indicates a virtual machine ID so that the controller 1308 can read or write state data from an appropriate PVRM memory location for the appropriate virtual machine. As shown in this example, multiple PVRMs (e.g., memory locations) for differing virtual machines are illustrated as 1312. Multiplexers 1314 and 1316 are controlled by the controller 1308 via control line 1318 to control whether data is written to the register file from the execution pipeline 804 or from the dedicated PVRM 810, or other PVRM 1312 depending upon a virtual machine ID. The controller 1308 also controls multiplexer 1322 to control a write or read enable to the register file. The enable for a write or read can come either from the execution pipeline 804 via line 1324 or from the controller 1308 via line 1326. Selecting between which entity controls the enable is done through control data 1328. Also, multiplexers 1330 and 1332 are controlled via control data 1334 to control whether addresses from the execution pipeline 804 are used or address information from controller 1308 is used depending upon whether a save or restore operation is performed or a normal operation is performed.

During a save operation, controller 1308 causes the register file to allow write data 1340 and 1342 along with corresponding write address 1344 and write enable 1346 to be controlled to allow writing of data from the register file for a save operation saving it to the dedicated on-die state memory 810. A read enable is used when a restore operation is to be performed and data is read from read lines 1346 and 1348 to restore data back to the register file for reinitiating operation by a virtual machine. The high bandwidth structure of this design allows high volumes of state information such as architectural state information or other information stored in the register file to be quickly written to persistent on-die memory for saving or restoring state information for virtual machines.

Figure 14:
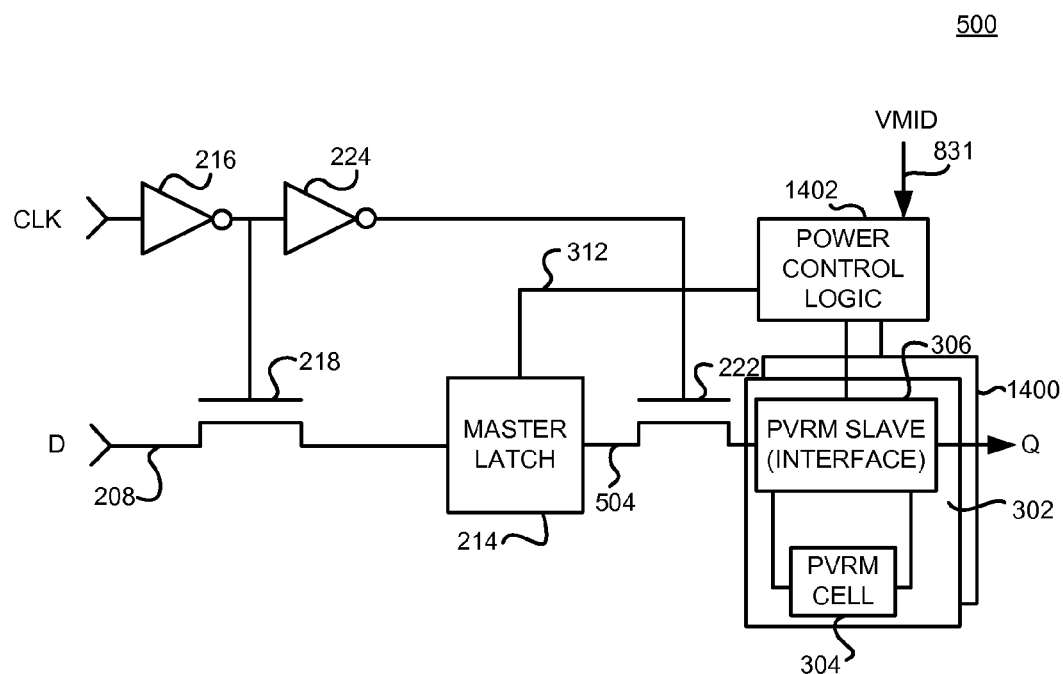
FIG. 14 is a block diagram of a portion of an integrated circuit die in accordance with one example set forth in the disclosure.

FIG. 14 illustrates a state backup structure for differing virtual machines on a flip-flop level. This design is similar to that found in FIG. 5 except additional PVRM slave interfaces and PVRM cells are duplicated as shown as element 1400 for each virtual machine. Accordingly, suitable control lines are also employed and the power control logic 1402 selects the appropriate PVRM cell to be accessed based on a virtual machine ID so that the appropriate cell is accessed for a save or restore operation for a particular virtual machine.

Figure 15:
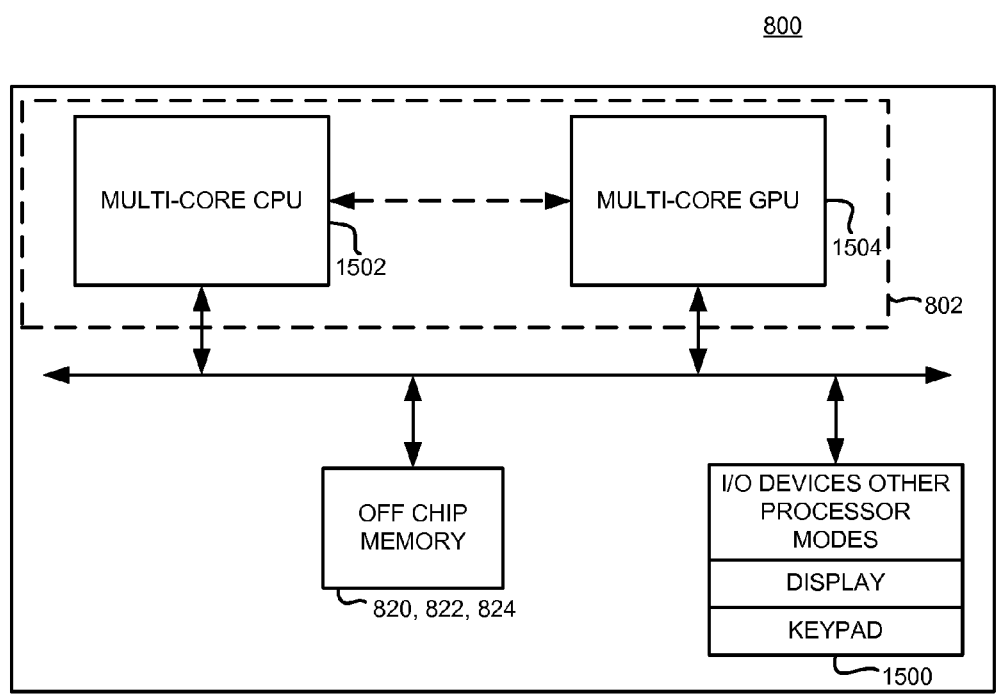
FIG. 15 is a block diagram illustrating one example of an apparatus employing a state store and restore operation using dedicated on-die persistent state retention memory in accordance with one example set forth in the disclosure.

FIG. 15 is a block diagram illustrating an apparatus 800 that also includes by way of example, I/O devices such as a display, keypad or any other suitable I/O devices generally illustrated as 1500 that can communicate with the integrated circuit 802 and the various processor execution pipelines illustrated in this example as differing CPU and/or GPU cores 1502 and 1504 respectively. For example, this apparatus may be a work station, handheld device such as a smart phone, printer or any other suitable apparatus.

Also, integrated circuit design systems (e.g., work stations including, as known in the art, one or more processors, associated memory in communication via one or more buses or other suitable interconnect and other known peripherals) are known that create wafers with integrated circuits based on executable instructions stored on a non-transitory computer readable medium such as but not limited to CDROM, RAM, other forms of ROM, hard drives, distributed memory, etc. The instructions may be represented by any suitable language such as but not limited to hardware descriptor language (HDL), Verilog, RTL or other suitable language. As such, the logic and circuits described herein may also be produced as integrated circuits by such systems using the computer readable medium with instructions stored therein. For example, an integrated circuit with the aforedescribed logic and structure may be created using such integrated circuit fabrication systems. The computer readable medium stores instructions executable by one or more integrated circuit design systems that causes the one or more integrated circuit design systems to design an integrated circuit. The designed integrated circuit includes an integrated circuit including at least one processing circuit operative to generate state information, corresponding on-die passive variable resistance memory, operatively coupled to the processing circuit, that is configured as dedicated on-die persistent state retention memory for state information of the processing circuit, and control logic operative to control at least one of saving or restoring of state information for different virtual machines operating on the processing circuit into corresponding on-die passive variable resistance memory in response to a virtual machine level state information save or restore condition, as noted above. The designed integrated circuit may also include the other structure as set forth above.

Among other advantages, the above structure allows the sharing of cores during normal operations for different virtual machines. Architectural state information can be saved so virtual machine can be shared on one or more processing cores. Persistent passive variable resistance memory that is on-die is dedicated for the state backup and can provide a type of parallel interface for architectural state store information as well as other state information if desired.

The disclosed integrated circuit designs may be employed in any suitable apparatus including but not limited to, for example, servers, printers, high definition televisions, handheld devices such as smart phones, tablets, portable devices such as laptops or any other suitable device. Such devices may include for example, a display that is operatively coupled to the integrated circuit where the integrated circuit may be, for example, a GPU, CPU or any other suitable integrated circuit that provides image data for output on the display. Such an apparatus may employ the integrated circuits as noted above including the active memory circuit and passive memory state backup circuits as described as well as one or more of the described configurations.

The above detailed description of the invention and the examples described therein have been presented for the purposes of illustration and description only and not by limitation. It is therefore contemplated that the present invention cover any and all modifications, variations or equivalents that fall within the spirit and scope of the basic underlying principles disclosed above and claimed herein.

What is claimed is:

1. A method for controlling state information retention in an apparatus comprising:
   determining at least a state information save or restore condition for at least one processing circuit in an integrated circuit die; and
   in response to determining the condition, controlling at least one of saving or restoring of state information for different virtual machines operating on the processing circuit into or from corresponding on-die passive variable resistance memory.

2. The method of claim 1 comprising determining whether to save or restore state information to the corresponding on-die passive variable resistance memory or to off-die memory based on virtual machine priority information.

3. The method of claim 1 wherein controlling at least one of saving or restoring of state information for the at least one processing circuit to corresponding on-die passive variable resistance memory comprises managing passive variable resistance memory state backup correlation data for a plurality of virtual machines.

4. The method of claim 1 comprising using a hypervisor to control the at least one of saving or restoring of state information for the processing circuit to corresponding on-die passive variable resistance memory based on switching of use of the processing by different operating system instances.

5. The method of claim 1 wherein controlling at least one of saving or restoring of state information for the processing circuit to corresponding on-die passive variable resistance memory comprises controlling the saving and restoring of state information:
   to/from a passive variable resistance persistent state memory dedicated for a pipeline cache;
   to/from a passive variable resistance persistent state memory dedicated for saving and restoring execution pipeline state information;
   to/from a passive variable resistance persistent state memory dedicated for a register file; and
   to/from a passive variable resistance persistent state memory dedicated for architectural state information.

6. The method of claim 1 comprising:
   executing a save state instruction that comprises data representing a save state command and an on die PVRM identifier corresponding to one of a set of on die PVRM memories corresponding to one of a plurality of virtual machines; and
   executing a restore state instruction that comprises data representing a restore command and an on die PVRM identifier corresponding to one of a set of on die PVRM memories corresponding to one of a plurality of virtual machines.

7. An integrated circuit comprising:
at least one processing circuit operative to generate state information;
corresponding on-die passive variable resistance memory, operatively coupled to the processing circuit, that is configured as dedicated on-die persistent state retention memory for state information of the processing circuit; and
control logic operative to control at least one of saving or restoring of state information for different virtual machines operating on the processing circuit into or from corresponding on-die passive variable resistance memory in response to a virtual machine level state information save or restore condition.

8. The integrated circuit of claim 7 wherein the control logic is operative to determine whether to save or restore state information to the corresponding on-die passive variable resistance memory or to off-die memory based on virtual machine priority information.

9. The integrated circuit of claim 7 wherein the control logic is operative to control at least one of saving or restoring of state information for the at least one processing circuit to corresponding on-die passive variable resistance memory by managing passive variable resistance memory state backup correlation data for a plurality of virtual machines.

10. The integrated circuit of claim 7 wherein the control logic executes a hypervisor to control the at least one of saving or restoring of state information for the processing circuit to corresponding on-die passive variable resistance memory based on switching of use of the processing by different operating system instances.

11. The integrated circuit of claim 7 wherein the control logic is operative to control at least one of saving or restoring of state information to corresponding on-die passive variable resistance memory by controlling the saving and restoring of state information:
to/from a passive variable resistance persistent state memory dedicated for a pipeline cache;
to/from a passive variable resistance persistent state memory dedicated for saving and restoring execution pipeline state information;
to/from a passive variable resistance persistent state memory dedicated for a register file; and
to/from a passive variable resistance persistent state memory dedicated for architectural state information.

12. The integrated circuit of claim 8 wherein the control logic:
executes a save state instruction that comprises data representing a save state command and an on die PVRM identifier corresponding to one of a set of on die PVRM memories corresponding to one of the plurality of virtual machines; and
executes a restore state instruction that comprises data representing a restore command and an on die PVRM identifier corresponding to one of a set of on die PVRM memories corresponding to one of the plurality of virtual machines.

13. An apparatus comprising:
an integrated circuit die comprising:
at least one processing circuit operative to generate state information;
corresponding on-die passive variable resistance memory, operatively coupled to the processing circuit, that is configured as dedicated on-die persistent state retention memory for state information of the processing circuit;
control logic operative to control at least one of saving or restoring of state information for different virtual machines operating on the processing circuit into or from corresponding on-die passive variable resistance memory in response to a virtual machine level state information save or restore condition; and
off die state information memory accessible by the on die processing circuit.

14. The apparatus of claim 13 wherein the control logic is operative to determine whether to save or restore state information to the corresponding on-die passive variable resistance memory or to off-die memory based on virtual machine priority information.

15. The integrated circuit of claim 13 wherein the control logic is operative to control at least one of saving or restoring of state information for the at least one processing circuit to corresponding on-die passive variable resistance memory by managing passive variable resistance memory state backup correlation data for a plurality of virtual machines.

16. The apparatus of claim 13 wherein the control logic executes a hypervisor to control the at least one of saving or restoring of state information for the processing circuit to corresponding on-die passive variable resistance memory based on switching of use of the processing by different operating system instances.

17. The apparatus of claim 13 wherein the control logic is operative to control at least one of saving or restoring of state information to corresponding on-die passive variable resistance memory by controlling the saving and restoring of state information:
to/from a passive variable resistance persistent state memory dedicated for a pipeline cache;
to/from a passive variable resistance persistent state memory dedicated for saving and restoring execution pipeline state information;
to/from a passive variable resistance persistent state memory dedicated for a register file; and
to/from a passive variable resistance persistent state memory dedicated for architectural state information.

18. The apparatus of claim 13 wherein the processing circuit:
executes a save state instruction that comprises data representing a save state command and an on die PVRM identifier corresponding to one of a set of on die PVRM memories corresponding to one of the plurality of virtual machines; and
executes a restore state instruction that comprises data representing a restore command and an on die PVRM identifier corresponding to one of a set of on die PVRM memories corresponding to one of the plurality of virtual machines.

19. A non-transitory computer readable medium comprising executable instructions that when executed cause an integrated circuit fabrication system to fabricate an integrated circuit comprising:
at least one processing circuit operative to generate state information;
corresponding on-die passive variable resistance memory, operatively coupled to the processing circuit, that is configured as dedicated on-die persistent state retention memory for state information of the processing circuit; and
control logic operative to control at least one of saving or restoring of state information for different virtual machines operating on the processing circuit into or from corresponding on-die passive variable resistance memory in response to a virtual machine level state information save or restore condition.

20. The storage medium of claim 19 comprising executable instructions that when executed cause an integrated circuit fabrication system to fabricate an integrated circuit wherein the control logic is operative to determine whether to save or restore state information to the corresponding on-die passive variable resistance memory or to off-die memory based on virtual machine priority information.

* * * * *